United States Patent
Bhaumik et al.

(10) Patent No.: US 11,271,572 B2
(45) Date of Patent: Mar. 8, 2022

(54) SELF-TUNING PHASE-LOCKED LOOP (PLL) CIRCUIT

(71) Applicant: Analog Devices International Unlimited Company, Limerick (IE)

(72) Inventors: Wreeju Bhaumik, Bangalore (IN); Batna Suryanarayana, Andhra Pradesh (IN); Dheeraj Arimboor, Palakkad (IN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/862,066

(22) Filed: Apr. 29, 2020

(65) Prior Publication Data
US 2021/0344348 A1 Nov. 4, 2021

(51) Int. Cl.
| H03L 7/00 | (2006.01) |
|---|---|
| H03L 7/093 | (2006.01) |
| H03L 7/107 | (2006.01) |
| H03L 7/099 | (2006.01) |

(52) U.S. Cl.
CPC ............ H03L 7/093 (2013.01); H03L 7/0992 (2013.01); H03L 7/1075 (2013.01)

(58) Field of Classification Search
CPC ... H03L 2207/50; H03L 7/0991; H03L 7/093; H03L 2207/06; H03L 7/0992; H03L 7/197; H03L 7/1075
USPC ........ 375/215, 252, 294, 327, 345, 371–376
See application file for complete search history.

(56) References Cited

U.S. PATENT DOCUMENTS

| 5,530,383 | A | 6/1996 | May | |
|---|---|---|---|---|
| 7,898,343 | B1 | 3/2011 | Janecsh | |
| 8,179,174 | B2 | 5/2012 | Bunch | |
| 9,791,834 | B1 * | 10/2017 | Nassar | G04F 10/005 |
| 10,516,405 | B2 * | 12/2019 | Yu | H03L 7/0991 |
| 10,895,850 | B1 * | 1/2021 | Elkholy | H03M 3/368 |
| 2007/0109030 | A1 | 5/2007 | Park | |
| 2010/0256937 | A1 * | 10/2010 | McKay | G01R 31/002 |
| | | | | 702/67 |
| 2012/0100821 | A1 * | 4/2012 | Dan | H03L 7/101 |
| | | | | 455/269 |
| 2012/0161834 | A1 * | 6/2012 | Lee | H03L 1/00 |
| | | | | 327/156 |

(Continued)

FOREIGN PATENT DOCUMENTS

CN 101159433 4/2008

OTHER PUBLICATIONS

Google Translation in English of the Abstract.

*Primary Examiner* — Emmanuel Bayard
(74) *Attorney, Agent, or Firm* — Patent Capital Group (57) ABSTRACT

Embodiments may relate to techniques or circuitry for the control of a clock signal by a phase-locked loop (PLL) circuit. The technique may include the identification of a first parameter related to a gain of a digitally controlled oscillator (DCO) and a second parameter related to a resolution of a time-to-digital converter (TDC). The technique may then include the identification of a third parameter related to filter coefficients of a loop filter of the PLL circuit based on the first and second parameter. The circuit may then output a clock signal based on the first, second, and third parameters. Other embodiments may be described or claimed.

20 Claims, 6 Drawing Sheets

(56) References Cited

U.S. PATENT DOCUMENTS

| | | | |
|---|---|---|---|
| 2013/0002317 A1* | 1/2013 | Frantzeskakis | H03L 7/08 327/156 |
| 2013/0265114 A1* | 10/2013 | Lee | H03L 7/093 331/1 A |
| 2014/0333351 A1* | 11/2014 | Ba | H03L 7/093 327/156 |
| 2014/0340161 A1* | 11/2014 | Canard | H03L 7/093 331/16 |
| 2015/0102845 A1* | 4/2015 | Tsai | H03L 7/093 327/159 |
| 2016/0204787 A1* | 7/2016 | Lotfy | H03L 7/085 327/142 |
| 2017/0366192 A1* | 12/2017 | Moehlmann | H03L 7/095 |
| 2019/0214999 A1* | 7/2019 | Yu | G04F 10/005 |
| 2020/0304131 A1* | 9/2020 | Candler | H03L 7/0994 |

\* cited by examiner

SELF-TUNING PHASE-LOCKED LOOP (PLL) CIRCUIT

BACKGROUND

A phase-locked loop (PLL) circuit may be used to convert a reference frequency to a desired clock frequency which may be used by various components of an electronic device. One measure of quality of the clock frequency may be the amount of jitter, or variation, in the clock frequency. It may be desirable to minimize the jitter for the sake of consistency in the electronic device.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As noted, a PLL circuit may be a circuit that is used by an electronic device, or an IC thereof, to produce a clock signal based on a provided reference signal. As noted, a measure of quality of an output clock may be "jitter," which may refer to the degree of variation in the clock signal output by the PLL.

In some embodiments, the behavior of a PLL circuit may vary from one silicon wafer to another, even if the different silicon wafers include PLL circuits with identical designs to one another. For example, the PLL circuit may be highly voltage dependent, and small voltage variations may affect the performance of the PLL circuit. As a result, different ICs may have PLL circuits with different jitter profiles.

Embodiments herein relate to PLL circuits that include an on-chip adaptive-bandwidth optimization circuit which may improve stability and jitter performance while reducing area or lock time of the PLL circuit. Specifically, embodiments may refer to a self-tuning PLL circuit which may iteratively optimize one or more parameters of the PLL to address jitter. This self-tuning is what may be referred to herein as "adaptive-bandwidth optimization."

Some embodiments may include a dual function or operational mode which may include both a phase-locked operational mode and a frequency-locked operational mode. The PLL circuit may use the frequency-locked operational mode to identify one or more parameters of the PLL circuit, which may put the clock signal close to a desired clock signal output. The PLL circuit may then use the phase-locked operational mode to fine tune the same or different coefficients of the PLL circuit, which may further tune the clock signal to the desired output. In some embodiments, the PLL circuit may additionally store the identified coefficients in a memory of the PLL circuit, the IC, or an electronic device of which the PLL circuit is a part. The identified coefficients may then be retrieved and used at device startup rather than having the PLL circuit re-tune itself.

Figure 1:
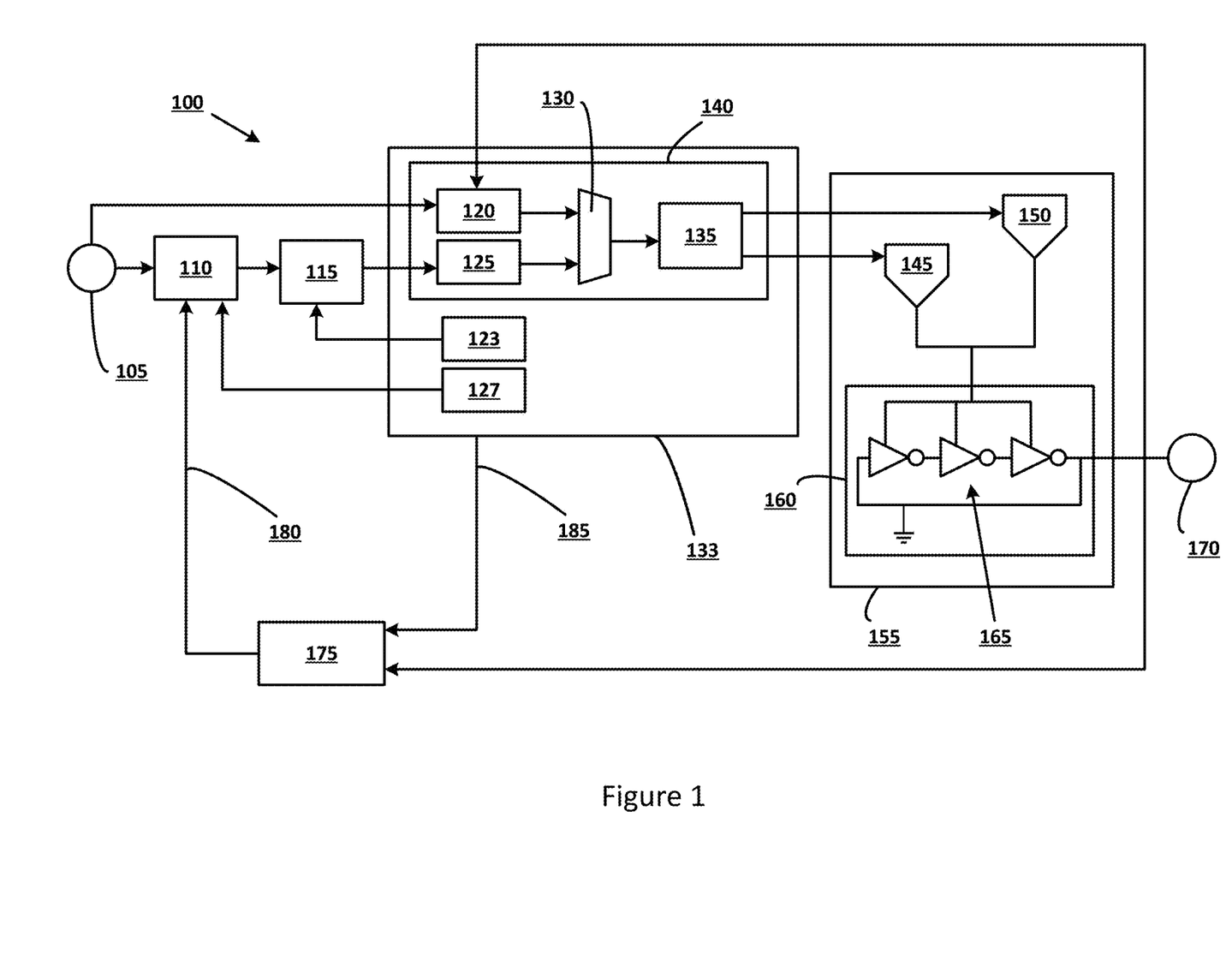
FIG. 1 depicts an example self-tuning PLL circuit, in accordance with various embodiments.

The PLL circuit may include a variety of components as illustrated in FIG. 1. Specifically, FIG. 1 depicts an example self-tuning PLL circuit 100, in accordance with various embodiments. In general, it will be understood that although certain elements are depicted in FIG. 1 in a certain configuration or location, other embodiments may include more or fewer elements, elements communicatively coupled in a different order, etc. As one example, although certain elements such as the time-to-digital converter (TDC) 110 and the filter 115 are depicted as communicatively coupled using a single depicted line, in some embodiments certain elements such as the TDC 110 may be coupled with the filter 115 by a plurality of conductive lines such as may be present in a bus. Additionally, it will be understood that certain elements such as logic, storage, passive elements (resistors, capacitors, inductors, etc.), or other elements may not be explicitly depicted in FIG. 1, but may still be present in real-world embodiments of the circuit. It will also be understood that the connections between elements are generally depicted for the sake of discussion herein and certain elements that are not depicted as directly coupled (e.g., the phase-lock controller 125 and divider 175, the TDC controller 127 and the DCO controller 140, etc. Other variations may be present in other embodiments.

The PLL circuit 100 may include a clock input 105 which may provide a reference clock signal which may be referred to as "REFCLK." REFCLK may be a reference clock signal that is provided by a crystal, a digital source, or some other type of source. Generally, it may be the task of the PLL circuit 100 to translate from the frequency of REFCLK to a consistent clock signal (which may be referred to as "DCO-CLK" or "VCOCLK." For the sake of consistency, the term DCOCLK will be used herein.) REFCLK may be provided to a TDC 110 which may digitize the phase difference between the pulse received from the clock input 105 and a feedback clock signal (FBCLK) 180 as described in greater detail below, and output an indication of the digitized phase difference.

In some embodiments, the TDC 110 may operate with a specific step size, which may be identified at startup by providing a test signal to the TDC 110 and analyzing the output of the TDC 110 in terms of amplitude, voltage, or some other factor. This step size may be referred to as a "resolution" of the TDC 110, and may be identified by, for example TDC controller 127 which may be discussed in greater detail below.

The TDC 110 may be communicatively coupled with a filter 115. In some embodiments, the filter 115 may be referred to as a "loop filter." In general, the filter 115 may include logic, other active elements, passive elements, etc. which may help determine loop dynamics or stability of the PLL circuit 100. The stability of the PLL circuit 100 may refer to the degree to which the PLL circuit 100 responds to changes in the REFCLK or other changes to the circuit. The filter 115 may also limit the amount of variation or ripple that is seen in the signal provided from the TDC 110 to other elements of the PLL circuit 100. In some embodiments, the filter 115 may be a low-pass filter, while in other embodiments the filter 115 may be a bandpass or high-pass filter. The filter 115 may be, for example, a first-order filter, a second-order filter, a third-order filter, etc. however, for the sake of discussion herein, the particular embodiment of FIG. 1 will be discussed with respect to the filter 115 being a second-order filter.

The filter 115 may be communicatively coupled with a PLL controller 133. The PLL controller 133 may include a number of modules including a DCO controller 140, a filter controller 123, and the TDC controller 127. The DCO controller 140 itself may include modules such as the frequency-lock controller 120 and a phase-lock controller 125. Generally, respective ones of the depicted modules such as the PLL controller 133, the DCO controller 140, the filter controller 123, the TDC controller 127, the frequency-lock controller 120, and the phase-lock controller 125 may be implemented as hardware, software, firmware. Generally, although the various controllers and elements are depicted separately from one another, in some embodiments certain of the controllers may be at least partially implemented in the same module such as the same piece of hardware, software, circuitry, firmware, etc.

In various embodiments, the TDC controller 127 may be configured to provide information or commands to, process information received from, or otherwise control the TDC 110. Specifically, the TDC controller 127 may provide a test pulse to the TDC 110 (or facilitate the provision of a test pulse to the TDC 110 from a signal source or signal supply that is internal or external to the PLL circuit 100). The TDC controller 127 may then measure or otherwise identify the resolution of the TDC 110 based on its response to the test pulse.

The filter controller 123 may be configured to provide information or commands to, process information received from, or otherwise control the filter 115. Specifically, in some embodiments the filter controller 123 may be configured to identify or provide one or more coefficients to the filter 115 for use by the filter 115. As will be described in greater detail below, in some embodiments the coefficients may be based on aspects such as gain of DCO 155, resolution of the TDC 110, or other factors.

In some embodiments, the filter controller 123 may include, or be coupled with, a storage (not shown separately for the sake of elimination of clutter and redundancy of the Figures). The storage may be, for example, a nonvolatile memory (NVM) such as a double data rate (DDR) memory, a flash memory, or some other type of memory. The storage may be an element of the PLL circuit 100 or the filter controller 123, may be on the same IC as the filter controller 123 or the PLL circuit 100, may be an element of an electronic device of which the PLL circuit 100 is a part, may be communicatively coupled with the electronic device, or may be otherwise communicatively coupled with one or more elements of the PLL circuit 100. In some embodiments, the storage may be configured to permanently or temporarily store one or more of the coefficients for use by the filter 115, or elements such as TDC resolution or DCO gain through which the filter coefficients may be derived. As noted, identical PLL circuit designs may perform differently on different wafers or in different ICs for a number of reasons. By storing one or more parameters or coefficients in the storage, the PLL controller 133 (and particularly the filter controller 123) may be able to retrieve the parameters specific to that PLL circuit at startup rather than being forced to iteratively identify the parameters each time. In some embodiments, the PLL controller 133 (and particularly the filter controller 123) may be configured to identify one or more of the parameters based on a look-up table in the storage. Therefore, startup time may be significantly shortened.

The PLL controller 133 in general, and specifically the DCO controller 140, may be coupled with a DCO 155. The DCO 155 may be configured to accept a digital signal and convert it to an output clock signal DCOCLK. The DCO controller 140 may include a number of elements which may control operation of the DCO 155.

The DCO controller 140 may include a frequency-lock controller 120 and a phase-lock controller 125. As has been noted, and as will be described in greater detail with respect to FIGS. 2 and 3, the PLL circuit 100 may include two general operational loops. One processing loop may be referred to as a frequency-lock loop. The frequency-lock controller 120 may include logic, passive elements, storage, other active elements, etc. which may control operation of the DCO 155 or some other element of the PLL circuit 100 when the signal is being processed in accordance with the frequency-lock loop. Generally, the frequency-lock loop may refer to the initial operational mode by which the PLL circuit 100 may self-tune various parameters such as the DCO gain.

The other processing loop may be referred to as a phase-locked loop. The phase-lock controller 125 may include logic, passive elements, storage, other active elements, etc. which may control operation of the DCO 155 or some other element of the PLL circuit 100 when the signal is being processed in accordance with the phase-locked loop. Generally, the phase-locked loop may refer to the operational mode by which the PLL circuit 100 may self-tune various parameters such as filter coefficients or TDC resolution. The phase-locked loop may further output a clock signal based on a reference clock signal for use by another element of an electronic device of which the PLL circuit 100 is a part.

In general, the phase-lock controller 125 or the frequency-lock controller 120 may be configured to process or otherwise alter a received signal. For example, as may be seen, in some embodiments the phase-lock controller 125 may be communicatively coupled in a signal path with the TDC 110 and the filter 115. By contrast, the frequency-lock controller 120 may be configured to directly receive REFCLK from the clock input 105 as shown in FIG. 1. In this way, the frequency-lock controller 120 may be configured to process the raw REFCLK signal, whereas the phase-lock controller 125 may be configured to operate on a digital signal that is filtered by the filter 115. However, it will be understood that in some embodiments the frequency-lock controller 120 may include an element which may operate similar to the TDC 110 or the filter 115. In other embodiments, the frequency-lock controller 120 may receive a signal from the TDC 110, the filter 115, or a separate TDC or filter. For example, the PLL circuit 100 may include two TDCs or two filters 115 that form separate signal pathways between the clock input 105 and the DCO controller 140. The processing of the phase-locked loop and the frequency-lock loop are described in further detail with respect to, for example, FIG. 2.

The DCO controller 140 may further include a multiplexer 130 that is communicatively coupled with the frequency-lock controller 120 and the phase-lock controller 125. The multiplexer 130 may be configured to receive inputs from the frequency-lock controller 120 or the phase-lock controller 125 and output a signal on a line to a binary-to-thermometer decoder 135. The binary-to-thermometer decoder 135 may include logic, passive elements, storage, active elements, etc. that are configured to convert a binary number (e.g., as may be received through the multiplexer 130 from the frequency-lock controller 120 or the phase-lock controller 125) into separate binary numbers that represent digits of a number according to another system such as a decimal number. The separate binary numbers may then be output from the DCO controller 140 to the DCO 155.

The DCO 155 may include a number of elements such as a fine digital-to-analog converter (DAC) 145, a coarse-DAC 150, and a ring oscillator 160. The ring oscillator 160 may include a number of inverters 165. Specifically, the ring oscillator 160 of FIG. 1 may include three inverters 165 and may be referred to as a three-stage ring oscillator. It will be understood that in other embodiments the ring oscillators 160 may have more or fewer inverters (e.g., more or fewer stages) than depicted in FIG. 1.

Generally, the fine-DAC 145 may be configured to perform fine tuning of the signal received from the binary-to-thermometer decoder 135. That is, the fine-DAC 145 may include logic, passive elements, storage, active elements, etc. which may alter the signal received from the DCO controller 140 at a first step size. The coarse-DAC 150 may include logic, passive elements, storage, active elements, etc. which may alter the signal received from the DCO controller 140 at a second step size which is greater than the first step size. Generally, as may be discussed in greater detail with respect to FIG. 2, the signal may be input to the coarse-DAC 150 for processing until a signal output by the DCO 155 is within a pre-identified threshold of a target DCOCLK signal. Once the signal is within that threshold, then the signal may be input to the fine-DAC for processing at the smaller step size until the DCO 155 outputs a DCOCLK signal that is within a second pre-identified threshold of a target DCOCLK signal. For example, the signal may be input to the coarse-DAC 150 until the signal is within 10% of the target DCOCLK signal. The signal may then be input to the fine-DAC 145 until the signal is within 1% of the target DCOCLK signal. It will be understood, however, that these ranges or thresholds may vary in other embodiments based on factors such as desired accuracy, desired time for tuning, or other factors. Once the DCOCLK signal is within the pre-identified threshold, then the DCOCLK signal may be output to the clock output 170 where it may then be transmitted to another element of an IC or electronic device such as a processor. In some embodiments, different ones of the DACs 145/150 may be used during different operational or calibration stages as will be described in greater detail with respect to FIG. 2. Specifically, in some embodiments the coarse-DAC 150 may be used primarily during the frequency-lock operational mode, and the fine-DAC 145 may be used primarily during the phase-lock operational mode.

The output of the DACs 145/150 may be input to the ring oscillator 160. In general, the ring oscillator 160 may be an electronic oscillator whose oscillation frequency is controlled by a voltage input. That is, the DACs 145/150 may produce a voltage based on the signals received from the DCO controller 140, and those signals may be input to the ring oscillator 160. The ring oscillator 160, in turn, may produce an oscillation frequency DCOCLK based on the voltage received from the DACs 145/150.

As may be seen, the DCOCLK signal output from the DCO 155 may be input back to the frequency-lock controller 120 of the DCO controller 140. In this way, one or more parameters of the PLL circuit may be iteratively identified, adjusted, or otherwise processed in the frequency-lock loop. One specific parameter which may be adjusted or identified by the frequency-lock loop controller 120 (or some other element of the PLL controller 133) may be the gain of the DCO 155. Specifically, the gain of the DCO 155 may refer to a parameter or factor (e.g., a multiplicative factor) by which the signal of the DCO 155 may be increased to achieve a desired DCOCLK output. In some embodiments, the gain may refer to increasing the amplitude, the frequency, or both of the DCO 155.

Additionally or alternatively, another parameter which may be identified or adjusted may be the resolution of the TDC 110. Specifically, as previously described, the resolution of the TDC 110 may be identified by provided a test pulse (e.g., by the TDC controller 127) to the TDC 110 and then identifying the response of the TDC.

Another parameter which may be identified may be, for example, coefficients for use by the filter 115. Specifically, the filter controller 123 may identify one or more coefficients for use by the filter 115 based on the DCO gain and the TDC resolution. In some embodiments, the identification of the various parameters or coefficients (e.g., the DCO gain or the filter coefficients) may be performed in an iterative manner wherein initial coefficients or parameters may be identified and then iteratively updated as will be described in greater detail below. In some embodiments, the iteration may be performed as part of the frequency-lock loop, the phase-locked loop, or both.

As may be seen in FIG. 1, the DCOCLK signal output from the DCO 155 may be input to a divider 175. Similarly, the PLL controller 133 (and more specifically, the DCO controller 140) may provide a signal 185 to the divider 175. The divider 175 may be a feedback divider that is configured to identify FBCLK 180 based on the provided DCOCLK signal from the DCO 155. Generally, the frequency of the DCOCLK signal may be considered to be a multiple of the frequency FBCLK signal, and related by a factor x such that DCOCLK=x*FBCLK. In some embodiments, x may be referred to as a multiplier select (MSEL). The signal 185 may provide a value for, or derivation of, MSEL. The FBCLK signal 180 may then be introduced to the TDC 110.

As described above, the PLL circuit 100 may iteratively alter parameters used by the PLL circuit 100. By iteratively altering the parameters, the DCOCLK signal produced by the DCO 155 may be adjusted until it is within the pre-identified threshold of the target DCOCLK signal. Additionally, by iteratively altering the parameters used by the PLL circuit 100, the jitter of the DCOCLK signal may be significantly reduced.

In general, the parameters may be identified or derived as follows. Specifically, a continuous-time approximation to a PLL open-loop function may be based on the following. Specifically, A(s), which may represent Open Loop Gain, may be based on $$A(s) \approx \frac{T_{REF}}{\Delta_{TDC}} \times \frac{1}{N} \times \frac{K_{DCO}}{s} \times H(s)$$

wherein $T_{REF}$ is the reference clock period (e.g., the period of REFCLK), $\Delta_{TDC}$ is the resolution of the TDC 110, and $K_{DCO}$ is the gain of the DCO 155, as described above. Specifically, $K_{DCO}$ may be the gain that is identified by, for example, the frequency-lock controller 120 or some other element of the PLL controller 133 as described above. N may similar to the factor x or the MSEL as described above, and may be viewed as the PLL clock multiplier ratio. 1/s may be the Laplace transformation of frequency to phase. H(s) may be the transfer function of the filter 115, and may be based on $$H(z) = \frac{b_0 + b_1 z^{-1} + b_2 z^{-2}}{1 + a_1 z^{-1} + a_2 z^{-2}}$$

wherein the parameters $b_0$, $b_1$, $b_2$, $a_1$, and $a_2$ are coefficients of a second-order filter transfer function. As noted, the various parameters may be based on, or otherwise derived from, parameters such as the gain of the DCO, the resolution of the TDC, or other parameters. H(z) may be the discrete time equivalent of H(s). It will be understood that these equations are intended as example equations of one embodiment, and other embodiments may use different equations related to the approximation of the open-loop function, the transfer function of the filter 115, etc.

Figure 2:
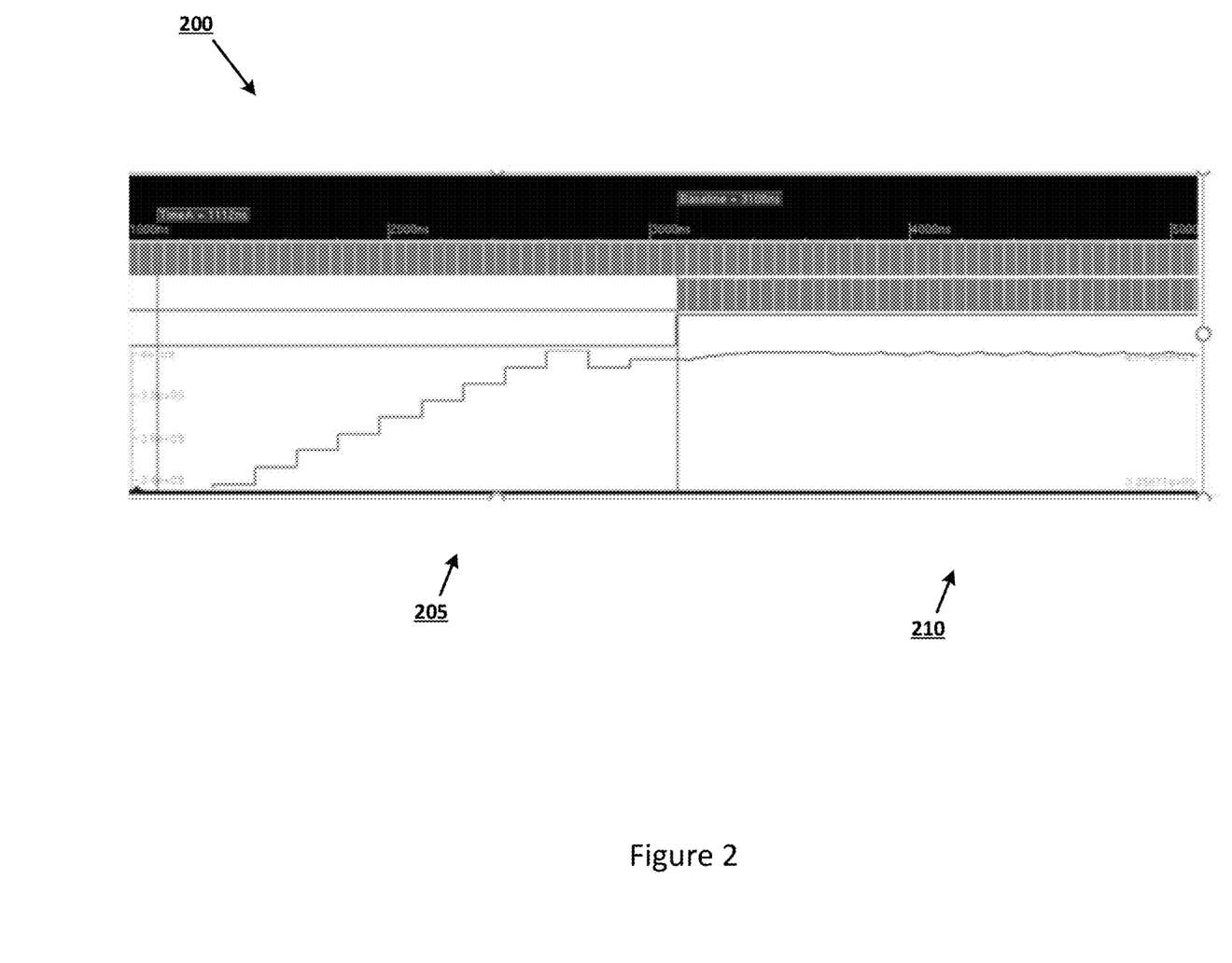
FIG. 2 depicts an example clock-frequency optimization of a self-tuning PLL circuit, in accordance with various embodiments.

FIG. 2 depicts an example clock-frequency optimization of a self-tuning PLL circuit, in accordance with various embodiments. Specifically, FIG. 2 depicts a graph 200 that shows clock-frequency optimization and self-tuning of a PLL circuit such as PLL circuit 100 that includes operation based on both a frequency-lock mode of operation and a phase-lock mode of operation. The x-axis may represent time, and the y-axis may represent an identified frequency of an output DCOCLK signal that may be output by a DCO such as DCO 155.

The clock-frequency optimization may be performed in two stages as described above. The first stage 205 may refer to the stage performed during the frequency-lock mode of operation as discussed above. The second stage 210 may refer to the stage performed during the phase-lock mode of operation as discussed above.

In general, as discussed above, the frequency-lock loop at 205 may iteratively identify one or more parameters of the PLL circuit 100 such as the gain of the DCO 155. To identify the DCO gain, a digital binary search may be used to tune the DCOCLK signal. The coarse-DAC 150 may iteratively process the provided signal to produce the DCOCLK signal which is then fed back to the PLL controller 133 and elements thereof such as the frequency-lock controller 120. The frequency-lock controller 120 may update one or more parameters of the DCO 155 (e.g., the DCO gain) and then the DCO 155, and particularly the coarse-DAC 150, may again process the signal. In this way, the various parameters of the PLL circuit 100 may be iteratively identified, and the output clock signal of the PLL circuit 100 may be tuned.

As may be seen in FIG. 2, the frequency-lock stage 205 may make a number of relatively large jumps as opposed to the variations in the subsequent phase-lock stage 210. Once the DCOCLK is identified by the DCO controller 140 to be within a pre-identified threshold of a target DCOCLK value, as described above, then the PLL circuit may switch to the phase-lock mode of operation at 210. In general, the use of the frequency-lock mode of operation may ensure that the DCOCLK frequency is within the pre-identified threshold, and may also restrict the maximum frequency overshoot between REFCLK and FBCLK during phase-lock.

During the phase-lock mode of operation, the PLL circuit 100 and, more specifically, the PLL controller 133 or elements thereof may further iteratively identify one or more parameters of the PLL circuit 100 such as the filter coefficients. As can be seen in FIG. 2, the iterative adjustment during the phase-lock stage 210 may be at a significantly finer granularity than the adjustment during the frequency-lock stage 205. During the phase-lock stage 210, the coarse-DAC 150 may be held at a constant value, however in some embodiments if the fine-DAC reaches saturation, then the coarse-DAC may be iterated (e.g., by one step) to account for the saturation.

Figure 3:
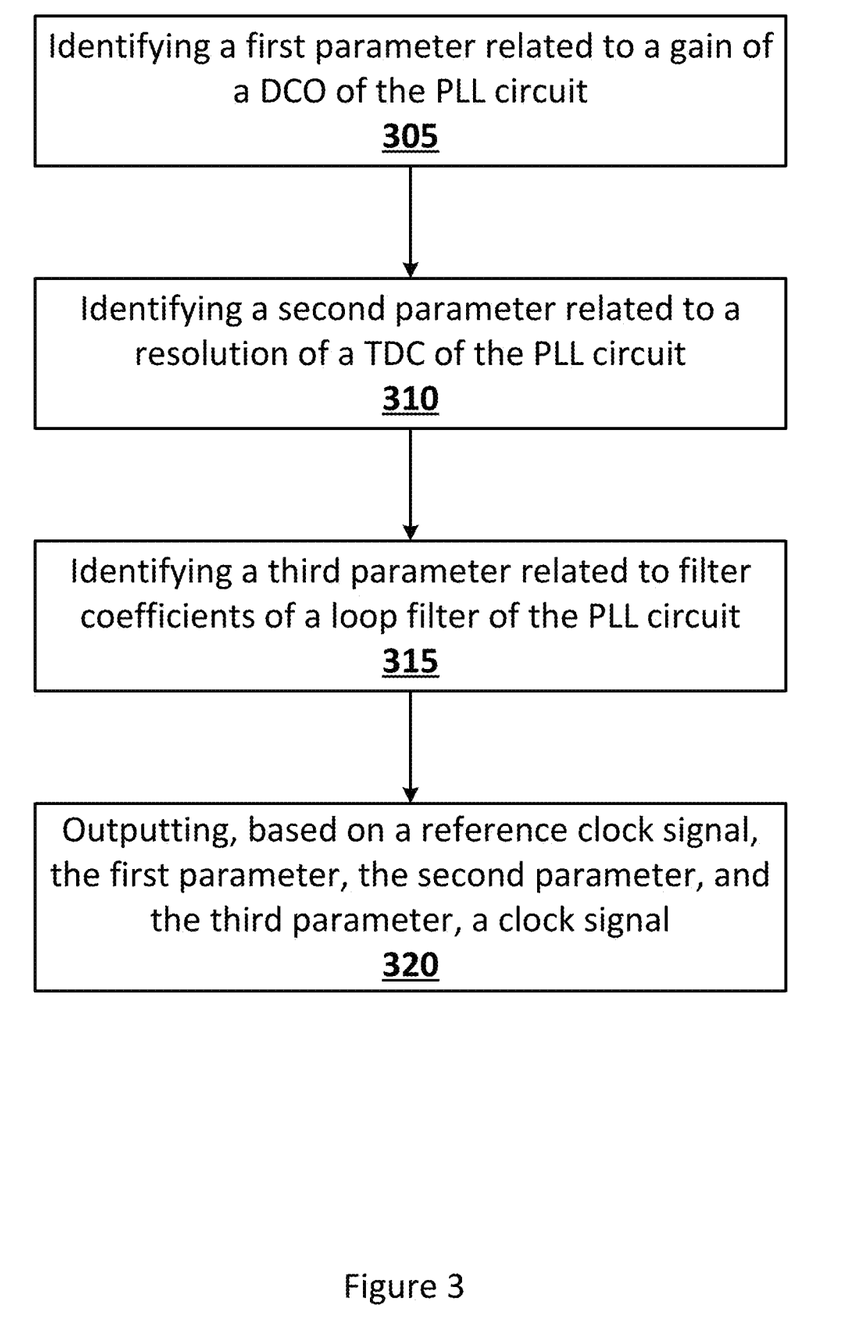
FIG. 3 depicts an example technique related to the operation of a self-tuning PLL circuit, in accordance with various embodiments.

FIG. 3 depicts an example technique related to the operation of a self-tuning PLL circuit. Generally, FIG. 3 is intended to depict a very high-level example of the technique described herein with respect to FIGS. 1 and 2. It will be understood that in some embodiments the technique may include more or fewer elements than discussed herein. It will also be understood that although certain elements are depicted as occurring sequentially within the technique, in other embodiments certain elements such as elements 310 and 305 may be performed concurrently with one another, or in a different order than depicted. Other variations may be present in other embodiments.

Generally, the technique may be performed by an element of the PLL circuit 100 such as the PLL controller 133 and elements thereof. Examples of various elements may be provided with respect to different aspects of FIG. 3; however, it will be understood that in other embodiments different elements may additionally or alternatively perform an aspect of the given technique. For example, although element 305 is described as performed by frequency-lock controller 120, in other embodiments element 305 may be additionally or alternatively performed by another element of the PLL controller 133, which may or may not be shown in FIG. 1. For example, in some embodiments the PLL controller 133 may include an element such as a DCO-gain controller, or some other element.

The technique may include identifying, at 305, a first parameter related to a gain of a DCO of the PLL circuit. For example, the technique may include identifying a parameter related to a gain of DCO 155 of PLL circuit 100. The parameter may be, or may be related to, $K_{DCO}$, and may be identified by an element of the PLL controller 133 such as the frequency-lock controller 120. As noted, in some embodiments, identification of the gain of the DCO 155 may be performed iteratively based on a technique such as successive approximation or binary search.

The technique may further include identifying, at 310, a second parameter related to a resolution of a TDC (e.g., TDC 110) of the PLL circuit. The parameter may be or may be related to, for example, $\Delta_{TDC}$ as described above. Specifically, identification of the resolution of the TDC may be performed at least in part by the TDC controller 127 based on provision of a test pulse to the TDC 110 as described above.

The technique may further include identifying, at 315, a third parameter related to filter coefficients of a loop filter (e.g., filter 115) of the PLL circuit. The parameter may be, or may be related to, one or more of the coefficients described above with respect to H(z) such as parameters $b_0$, $b_1$, $b_2$, $a_1$, $a_2'$ etc. As noted, the identification of the parameters may be based on the DCO gain and the TDC resolution. In some embodiments, identification of the coefficients may be based on iterative identification of the coefficients. In some embodiments, identification of the coefficients may be performed by, for example, an element of a PLL controller 133 such as the filter controller 123. In some embodiments, identification of the coefficients may be based on retrieval of the coefficients from memory, for example through a look-up table or some other data structure.

The technique may further include outputting, at 320, based on the reference clock signal such as REFCLK, the first parameter, the second parameter, and the third parameter, a clock signal such as DCOCLK.

Figure 4:
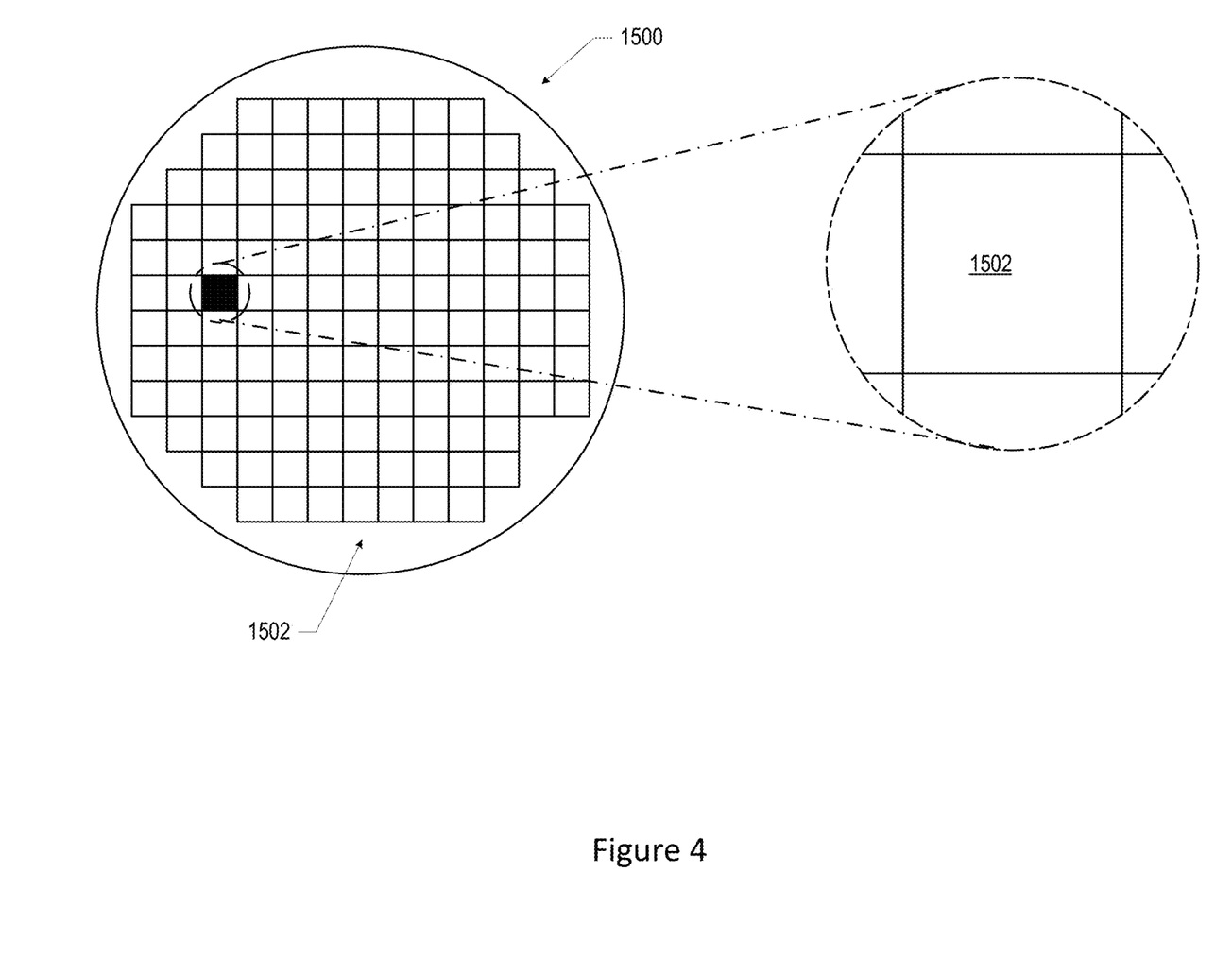
FIG. 4 is a top view of a wafer and dies that may include a self-tuning PLL circuit, in accordance with various embodiments.

FIG. 4 is a top view of a wafer 1500 and dies 1502 that may include one or more self-tuning PLL circuits, or may be included in an IC package including one or more self-tuning PLL circuits in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more self-tuning PLL circuits, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 6) or other logic that is configured to store information in the memory devices or execute instructions stored in the memory array.

Figure 5:
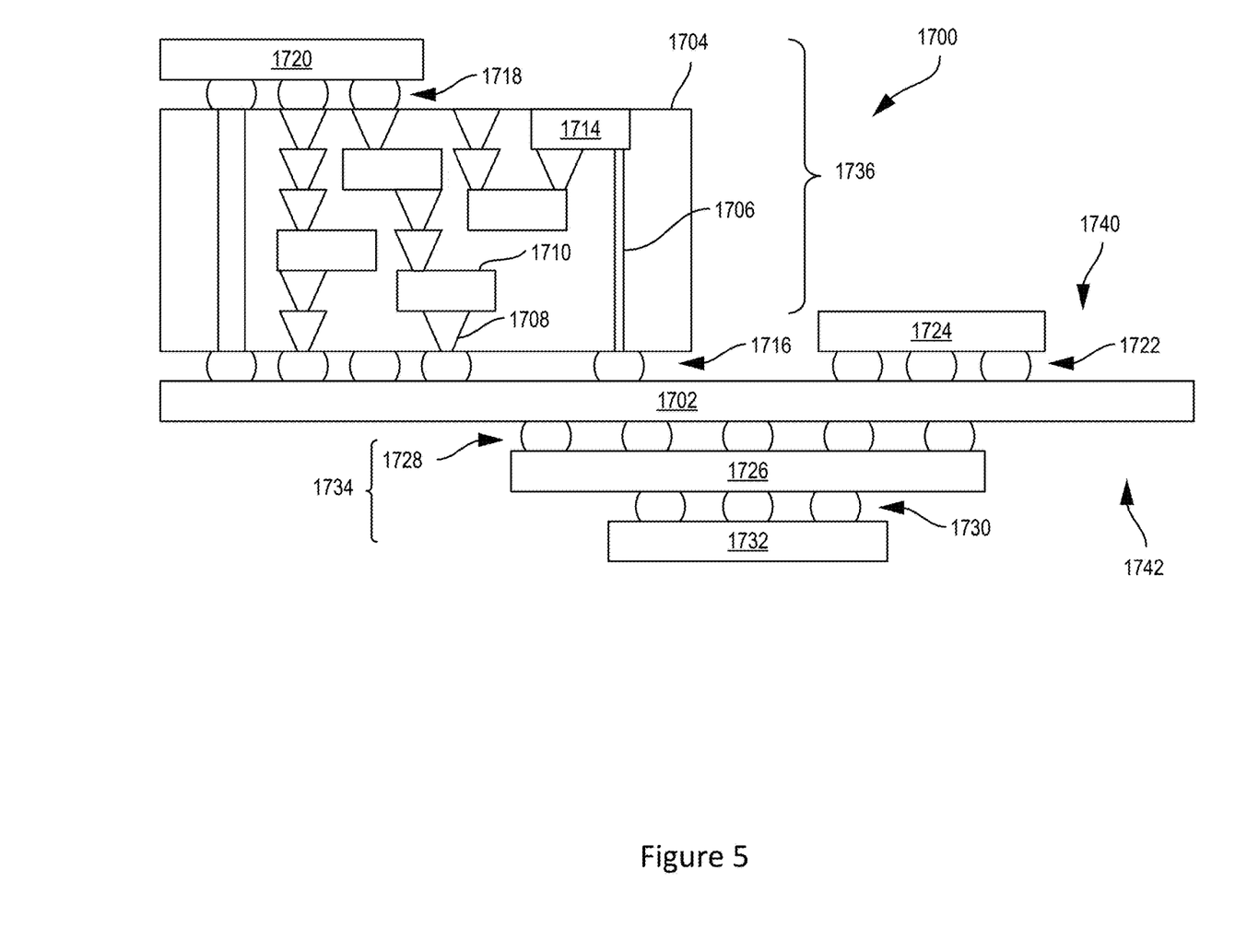
FIG. 5 is a side, cross-sectional view of an integrated circuit (IC) device assembly that may include a self-tuning PLL circuit, in accordance with various embodiments.

FIG. 5 is a side, cross-sectional view of an IC device assembly 1700 that may include one or more IC packages or other electronic components (e.g., a die) including one or more self-tuning PLL circuits, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 5 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 5), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 5, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 5, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more self-tuning PLL circuits.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 5 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 6:
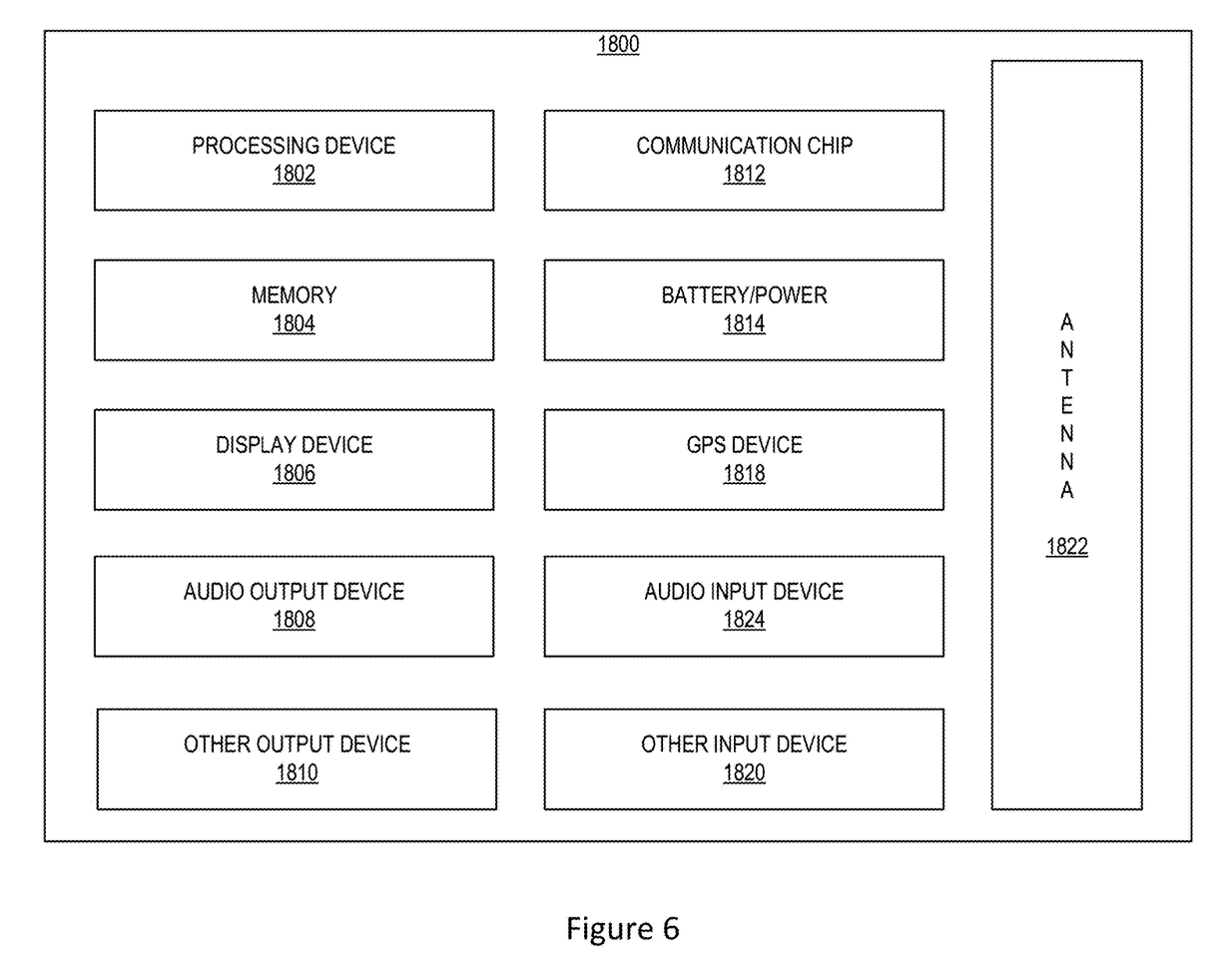
FIG. 6 is a block diagram of an example electrical device that may include a self-tuning PLL circuit, in accordance with various embodiments.

FIG. 6 is a block diagram of an example electrical device 1800 that may include one or more self-tuning PLL circuits, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. 6 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 6, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a method of controlling a clock signal by a phase-locked loop (PLL) circuit, wherein the method comprises: identifying, by the PLL circuit, a first parameter related to a gain of a digitally controlled oscillator (DCO) of the PLL circuit; identifying, by the PLL circuit, a second parameter related to a resolution of a time-to-digital converter (TDC) of the PLL circuit; identifying, by the PLL circuit, a third parameter related to filter coefficients of a loop filter of the PLL circuit; and outputting, by the PLL circuit based on a reference clock signal, the first parameter, the second parameter, and the third parameter, the clock signal.

Example 2 includes the method of example 1, wherein the identifying the first parameter is performed by a frequency-lock loop of the PLL circuit.

Example 3 includes the method of example 1, wherein the identifying the second parameter is based on provision of a test pulse to the TDC.

Example 4 includes the method of example 1, wherein the identifying the third parameter is based on the first parameter and the second parameter.

Example 5 includes the method of any of examples 1-4, wherein the method further comprises storing, by the PLL circuit, the third parameter in a memory that is communicatively coupled with the PLL circuit.

Example 6 includes the method of any of examples 1-4, wherein the identifying the third parameter includes identifying, by the PLL circuit, the third parameter in a memory that is communicatively coupled with the PLL circuit.

Example 7 includes the method of any of examples 1-4, wherein the identifying the third parameter includes identifying, by the PLL circuit, the third parameter based on a look-up table.

Example 8 includes the method of any of examples 1-4, wherein the identifying the first parameter includes iterative identification of the first parameter.

Example 9 includes the method of example 8, wherein the iterative identification includes successive approximation or binary search.

Example 10 includes a phase-locked loop (PLL) circuit comprising: a time-to-digital convertor (TDC) to identify a divided output clock and a reference clock signal; a digital filter; a digitally controlled oscillator (DCO) controller that includes: a frequency lock loop controller to identify a gain of a DCO of the PLL circuit; a TDC controller to identify a resolution of the TDC; and a filter controller to identify a coefficient of the digital filter based on the gain of the DCO and the resolution of the TDC; and the DCO, wherein the DCO is to provide an output clock signal based on the reference clock signal and the coefficient.

Example 11 includes the PLL circuit of example 10, wherein the output clock signal is further based on the gain of the DCO and the resolution of the TDC.

Example 12 includes the PLL circuit of example 10, wherein the frequency lock loop controller is to identify the gain of the DCO prior to the identification of the resolution of the TDC.

Example 13 includes the PLL circuit of any of examples 10-12, wherein an output of the DCO is input to the DCO controller.

Example 14 includes the PLL circuit of example 13, wherein the output of the DCO is input to the DCO controller to iteratively identify the gain of the DCO.

Example 15 includes the PLL circuit of any of examples 10-12, wherein the TDC is to dynamically adjust a phase of the output clock signal based on the divided output clock.

Example 16 includes the PLL circuit of any of examples 10-12, wherein the digital filter is a second-order digital filter.

Example 17 includes the PLL circuit of any of examples 10-12, wherein the DCO includes a coarse digital-to-analog converter (DAC) and a fine DAC.

Example 18 includes an electronic device comprising: a reference clock signal generator to generate a reference clock signal; a processor to process an output clock signal; and a phase-locked loop (PLL) circuit that includes: a digitally controlled oscillator (DCO) controller to identify, based on a gain of a DCO of the PLL circuit and a resolution of a time-to-digital converter (TDC) of the PLL circuit, a coefficient of a digital filter of the PLL circuit; and the DCO, wherein the DCO is to output, based on the reference clock signal and the coefficient, the output clock signal.

Example 19 includes the electronic device of example 18, further comprising a storage communicatively coupled with the PLL circuit, wherein the gain of the DCO, the resolution of the TDC, or the coefficient are based on a pre-stored value in the storage.

Example 20 includes the electronic device of example 18, wherein the DCO controller is to iteratively identify the gain of the DCO.

Example 21 includes the electronic device of any of examples 18-20, wherein the digital filter is a second-order digital filter.

Example 22 includes the electronic device of any of examples 18-20, wherein the PLL circuit is to identify the resolution of the TDC based on provision of a test pulse to the TDC.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A method of controlling a clock signal by a phase-locked loop (PLL) circuit, wherein the method comprises:
   identifying, by the PLL circuit, a first parameter related to a gain of a digitally controlled oscillator (DCO) of the PLL circuit;
   identifying, by the PLL circuit, a second parameter related to a resolution of a time-to-digital converter (TDC) of the PLL circuit, wherein the second parameter is identified based on provision of a test signal to the TDC and analyzing an output generated by the TDC in response to the TDC receiving the test signal;
   setting coefficients of a loop filter of the PLL circuit to modify a loop gain of the PLL circuit based on the first parameter and the second parameter; and
   outputting, by the PLL circuit, the clock signal, where the clock signal is based on the coefficients of the loop filter.

2. The method of claim 1, wherein the method further comprises storing the coefficients of the loop filter in a memory that is communicatively coupled with the PLL circuit.

3. The method of claim 1, wherein setting the coefficients of the loop filter includes identifying, by the PLL circuit, the coefficients of the loop filter in a memory that is communicatively coupled with the PLL circuit.

4. The method of claim 1, wherein the setting the coefficients of the loop filter includes identifying, by the PLL circuit, the coefficients of the loop filter based on a look-up table.

5. The method according to claim 1, wherein modifying the loop gain based on the first parameter and the second parameter includes setting the coefficients of the loop filter to compensate for variations in the gain of the DCO and the resolution of the TDC.

6. A phase-locked loop (PLL) circuit, comprising:
   a time-to-digital convertor (TDC);
   a digitally controlled oscillator (DCO);
   a filter; and
   a controller, configured to:
      identify a gain of the DCO,
      identify a resolution of the TDC by controlling that a test signal is provided to the TDC and by analyzing an output generated by the TDC in response to the TDC receiving the test signal, and
   set one or more coefficients of the filter to modify a loop gain of the PLL circuit based on the identified gain of the DCO and the identified resolution of the TDC, wherein the loop gain is proportional to each of the gain of the DCO and a function of the one or more coefficients of the filter, and inversely proportional to the resolution of the TDC, and wherein the DCO is configured to provide an output clock signal based on a reference clock signal and the one or more coefficients.

7. The PLL circuit of claim 6, wherein the controller is configured to identify the gain of the DCO prior to the identification of the resolution of the TDC.

8. The PLL circuit of claim 6, wherein the controller is configured to receive the output clock signal provided by the DCO.

9. The PLL circuit of claim 8, wherein the controller is configured to iteratively identify the gain of the DCO based on the output clock signal provided by the DCO.

10. The PLL circuit of claim 6, wherein the TDC is configured to dynamically adjust a phase of the output clock signal based on a divided output clock.

11. The PLL circuit of claim 6, wherein the filter is a second-order filter.

12. The PLL circuit according to claim 6, wherein the controller is configured to set the one or more coefficients to compensate for variations in the gain of the DCO and the resolution of the TDC.

13. The PLL circuit according to claim 6, wherein the controller is configured to set the one or more coefficients to reduce the loop gain based on the gain of the DCO and the resolution of the TDC.

14. The method according to claim 6, wherein the controller is configured to set the one or more coefficients to increase the loop gain based on the gain of the DCO and the resolution of the TDC.

15. The PLL circuit according to claim 6, wherein the controller is configured to set the one or more coefficients to modify the loop gain of the PLL circuit by modifying a transfer function of the filter.

16. The PLL circuit of claim 6, wherein analyzing the output generated by the TDC includes analyzing one or more of an amplitude and a voltage of the output.

17. An electronic device, comprising:
a reference clock signal generator to generate a reference clock signal; and
a phase-locked loop (PLL) circuit that includes:
a time-to-digital converter (TDC),
a digitally controlled oscillator (DCO),
a filter, and
a controller to set, based on a gain of a DCO and a resolution of the TDC, at least one coefficient of the filter to achieve a target loop gain,
wherein the loop gain is proportional to each of the gain of the DCO and a function of the at least one coefficient of the filter, and inversely proportional to the resolution of the TDC,
wherein the DCO is configured to generate a clock signal based on the reference clock signal and the at least one coefficient, and
wherein the controller is configured to identify the resolution of the TDC based on an output generated by the TDC in response to the TDC receiving a test signal.

18. The electronic device of claim 17, further comprising a storage communicatively coupled with the PLL circuit, wherein one or more of the gain of the DCO, the resolution of the TDC, and the at least one coefficient are based on a pre-stored value in the storage.

19. The electronic device according to claim 17, wherein the controller is configured to set the at least one coefficient to modify a transfer function of the filter based on the gain of the DCO and the resolution of the TDC.

20. The electronic device of claim 17, wherein identifying the resolution of the TDC based on the output generated by the TDC includes analyzing one or more of an amplitude and a voltage of the output.

* * * * *